United States Patent [19]

Okamoto

[11] Patent Number: 4,864,353
[45] Date of Patent: Sep. 5, 1989

[54] IMAGE RECORDING APPARATUS
[75] Inventor: Tsugio Okamoto, Kani, Japan
[73] Assignee: Brother Kogyo Kabushiki Kaisha, Nagoya, Japan
[21] Appl. No.: 213,295
[22] Filed: Jun. 29, 1988
[30] Foreign Application Priority Data
Jul. 3, 1987 [JP] Japan .................. 62-167413
[51] Int. Cl.⁴ ............................................. G03B 27/52
[52] U.S. Cl. ........................................ 355/27; 346/150
[58] Field of Search ................... 355/27, 32; 430/138; 346/150, 153.1

[56] References Cited
U.S. PATENT DOCUMENTS 4,748,475  5/1988  Ishiyama et al. ................ 355/27
4,772,922  9/1988  Kawahara et al. ............... 355/32
4,785,316  11/1988 Yamamoto et al. .............. 346/150
4,810,614  3/1989  Sangyoji et al. ................ 430/138

Primary Examiner—L. T. Hix
Assistant Examiner—Brian W. Brown
Attorney, Agent, or Firm—Oliff & Berridge

[57] ABSTRACT

An image recording apparatus for providing an image on a photosensitive recording medium comprising: a light-transmissive image carrier for carrying a light shielding image thereon; image forming means for forming the light-shielding image on the image carrier based on given image information; exposure means which applies light to the photosensitive recording medium through the image carrier for forming a latent image on the photosensitive recording medium, the photosensitive recording medium being disposed in confronting relation with the image carrier at least at the exposure means; image developing means disposed at downstream side of the exposure means for visualizing the latent image on the photosensitive recording medium; enlarging means connected to the image forming means for providing an enlarged image information to form the light-shielding image having enlarged size on the image carrier with respect to the image information; and reducing means disposed at the exposure means for reducing the latent image to be formed on the photosensitive recording medium with respect to the light-shielding image on the image carrier.

7 Claims, 3 Drawing Sheets

IMAGE RECORDING APPARATUS

BACKGROUND OF THE INVENTION

The present invention relates to an image recording apparatus for recording an image information on a photosensitive recording medium.

Image information may be recorded on a photo-sensitive pressure-sensitive recording sheet in different ways. For example, image information may be scanned and exposed directly to a photosensitive pressure-sensitive recording sheet by using switchable light such as a laser beam. Alternatively, light information may be written on a photosensitive pressure-sensitive recording sheet with a microshutter such for example as a liquid crystal light shutter being disposed between the sheet and a continuously energized lamp. These methods however have the following problems:

With respect to the former method, photosensitive pressure-sensitive recording sheets that are presently manufactured have spectral sensitivities below a wavelength $\lambda=475$ nm. Therefore, the laser beam source for scanning and exposing the sheets should be an argon laser beam source (wavelength $\lambda=351$ nm), a krypton laser beam source (wavelength $\lambda=351$ nm), a helium-cadmium laser beam source (wavelength $\lambda=325$ nm), or an ultraviolet gas laser. These laser devices are however large in size and expensive.

As regards the latter method, where a liquid crystal light shutter is employed as the microshutter, the liquid crystal itself is deteriorated by ultraviolet radiation.

A picture image recording apparatus designed to eliminate the aforesaid difficulties is disclosed in Japanese Patent Application Kokai No. 62-231965 (corresponding to U.S. Pat. Application No. 32,865, U.S. Pat. No. 4,772,922).

In the disclosed picture image recording apparatus, a latent image corresponding to a picture image on an original is formed on a transparent photosensitive body as a latent image carrier, and a light-shielding material is coated on the latent image. A photosensitive pressure-sensitive sheet and an exposure device are disposed one on each side of the transparent photosensitive body, and the sheet is exposed to light from the exposure device through the light-shielding material and the transparent photosensitive body.

The sheet carries a multiplicity of microcapsules on its surface. The microcapsules can be solidified by exposure to light, but remains soft unless exposed to light. The microcapsules as hardened by exposure to light are not ruptured when pressure is applied to the sheet. Those microcapsules are soft because light is prevented from being applied thereto by the light-shielding material are however ruptured by such pressure. The recording sheet therefore develops color by a coloring agent contained in the microcapsules. Therefore, a picture image corresponding to the latent image on the transparent photosensitive body is formed on the sheet. The developed picture image is identical to the picture image on the original. Thus, the picture image on the original is now duplicated.

The picture image recording apparatus described above is free from the problems of the conventional apparatus using a photosensitive pressure-sensitive sheet, i.e., large size of the exposure scanning means and deterioration of the microshutter. However, in the recording apparatus, more improved final output image has been demanded.

Another type of image recording apparatus has been developed in the art. One such image recording apparatus is disclosed in commonly assigned U.S. Pat. Application No. 50,313 filed on May 14, 1987, U.S. Pat. No. 4,810,614, this copending application corresponds to Japanese patent application Kokai No. 62-269961 published on Nov. 24, 1987.)

According to the disclosed apparatus, a first exposure unit is provided on a photosensitive drum so as to provide a latent image on the drum in accordance with an image information. Further, a first developing unit is provided to form light shieldable visible image corresponding to the latent image with using toners. The toner image is then transferred to a light transmission member formed of an endless transparent insulation film by means of a transfer unit. The transmission member carrying thereon the light shieldable visible toner image is delivered onto a photosensitive recording medium. When the toner image is comming to a given position, a second exposure unit irradiates diffusion light, so that a latent image is formed on the photosensitive recording medium through the visible image on the transmission member. Thus formed latent image on the photosensitive recording medium then becomes a visible or output image when the photosensitive recording medium passes through a second developing unit consisting of pressure developing rollers.

According to the image recording apparatus disclosed in the copending application Ser. No. 50,313, the photosensitive drum forms the light shieldable toner image whose dimension is equal to that of an original image information. The visible toner image is then transferred onto the transmission member, and the latter is in close contact with the photosensitive medium for the light-exposure so as to form the latent image thereon. The latter latent image on the photosensitive sheet also has the size equal to the light shieldable toner image on the transmission member. However, demand has been made for providing highly sophisticated final output image on the photosensitive recording medium, and another demand resides in the provision of a compact apparatus yet providing desirable output image.

Still another image recording apparatus is disclosed in commonly assigned U.S. Pat. Application Ser. No. 157,740 filed Feb. 18, 1988, U.S. Pat. No. 4,785,346.

In the disclosed image recording apparatus, image information to be recorded is reduced in size by a control unit, and then an electrostatic latent latent image is formed on a photosensitive drum based on the image information by a first exposure unit. The latent image on the photosensitive drum is developed with toner by a first image developing unit, and the developed light shieldable toner visible image is transferred onto a transmissive member comprising a transparent insulative film by an image transfer unit. The transferred image is delivered into a position above a photosensitive recording sheet upon movement of the transmissive member. Diffusive light is applied to the transmissive member which bears the light-shielding developed image by a second exposure device. The light which has passed through the developed image is enlarged by an enlarging means such as a lens and applied to the photosensitive recording sheet to form a latent image thereon. The latent image is then developed into a visible image by a second image developing unit comprising pressure developing rollers.

According to the above process, therefore, the light-shielding image which is smaller in size then the original image information is first formed on the transparent film, and thereafter the image on the transparent film is enlarged in size and formed on the photosensitive recording sheet thereby to produce a full-size image thereon which is equal in size to the original image information.

In the image recording apparatus disclosed in the copending U.S. Pat. Application Ser. No. 157,740, the image is first reduced at the first image developing device, so that the photosensitive drum as well as the transparent insulative film can have reduced size. And then the reduced image is enlarged to the original image size. Accordingly, the image recording apparatus disclosed in USSN 157,740 has advantage over the USSN 50,131 in that the latter should provide first light exposure and image developing units having dimensions sufficient to transfer the image having size always equal to that of the original image. In the USSN 157,740, because of the minimization of the first light exposure and image developing units, electrical charge to the photosensitive drum can be uniformly performed, and toner can be uniformly distributed over the peripheral surface of the drum because of its small peripheral area. Further, sufficient light exposure by means of a laser beam can be attained because of the small scanning length. Furthermore, the transparent sheet can also be minimized, so that it becomes much easier to control travelling condition thereof.

Even though the image recording apparatus according to USSN 157,740 can provide the above-described advantages, primary attention must still be drawn to the quality of the final output image formed on the photosensitive recording sheet. In this connection, in the apparatus disclosed in USSN 157,740, the resolution of the image (output image) on the photosensitive recording sheet is 1/(magnification) of the resolution of the image on the transparent film, since the smaller size is first formed on the transparent film and then enlarged by the enlarging means and formed on the photosensitive recording sheet. Therefore, even if the image formed by the first exposure and image developing units is of high resolution, the resolution of the final image is lower than the resolution of the image formed by the first exposure and image developing units since the image produced by the light applied from the second exposure unit is enlarged in size.

At present, various sheet sizes such as A4, B4, A3 sizes are available in large quantities in the market, and the image recording apparatus are no longer limited to use of any particular sheet size. In addition, finally produced images are required to be of high resolution which is by far important in nowadays trend, and hence the quality of final images governs the commercial success of image recording apparatus. Consequently, image recording apparatus, no matter whether they may be expensive or inexpensive, they should produce images of high resolution with good reproducibility for their success in the market.

Other copending U.S. Patent Applications commonly assigned have been filed bearing Ser. Nos. 184,576 filed Apr. 21, 1988, 156,744 filed Feb. 18, 1988 and 173,610 filed Mar. 25, 1988.

SUMMARY OF THE INVENTION

In view of the aforesaid problems of the conventional image recording apparatus and other apparatus disclosed in those copending U.S. Patent Applications, it is an object of the present invention to provide an image recording apparatus capable of producing a final image formed by second exposure and second image developing units which image is higher in resolution and quality than an image that has been formed on a transparent film by first exposure and image developing units.

To achieve the above object, there is provided in accordance with the present invention an image recording apparatus for providing an image on a photosensitive recording medium comprising: a light-transmissive image carrier for carrying a light shielding image thereon; image forming means for forming the light-shielding image on the image carrier based on given image information; exposure means which applies light to the photosensitive recording medium through the image carrier for forming a latent image on the photosensitive recording medium, the photosensitive recording medium being disposed in confronting relation with the image carrier at least at the exposure means; image developing means disposed at downstream side of the exposure means for visualizing the latent image on the photosensitive recording medium; enlarging means connected to the image forming means for providing an enlarged image information to form the light-shielding image having enlarged size on the image carrier with respect to the image information; and reducing means disposed at the exposure means for reducing the latent image to be formed on the photosensitive recording medium with respective to the light-shielding image on the image carrier.

A light-shielding image is formed on the image carrier at a given enlargement ratio with respect to the image information, and thereafter light is applied through the image carrier to the photosensitive recording medium by the exposure means to form a latent image on the photosensitive recording medium at a given reduction ratio with respect to the light-shielding image. Then, the latent image is developed into a visible image. Therefore, the latent image on the photosensitive recording medium is higher in resolution than the light-shielding image on the image carrier, and hence the developed visible image is of high quality.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
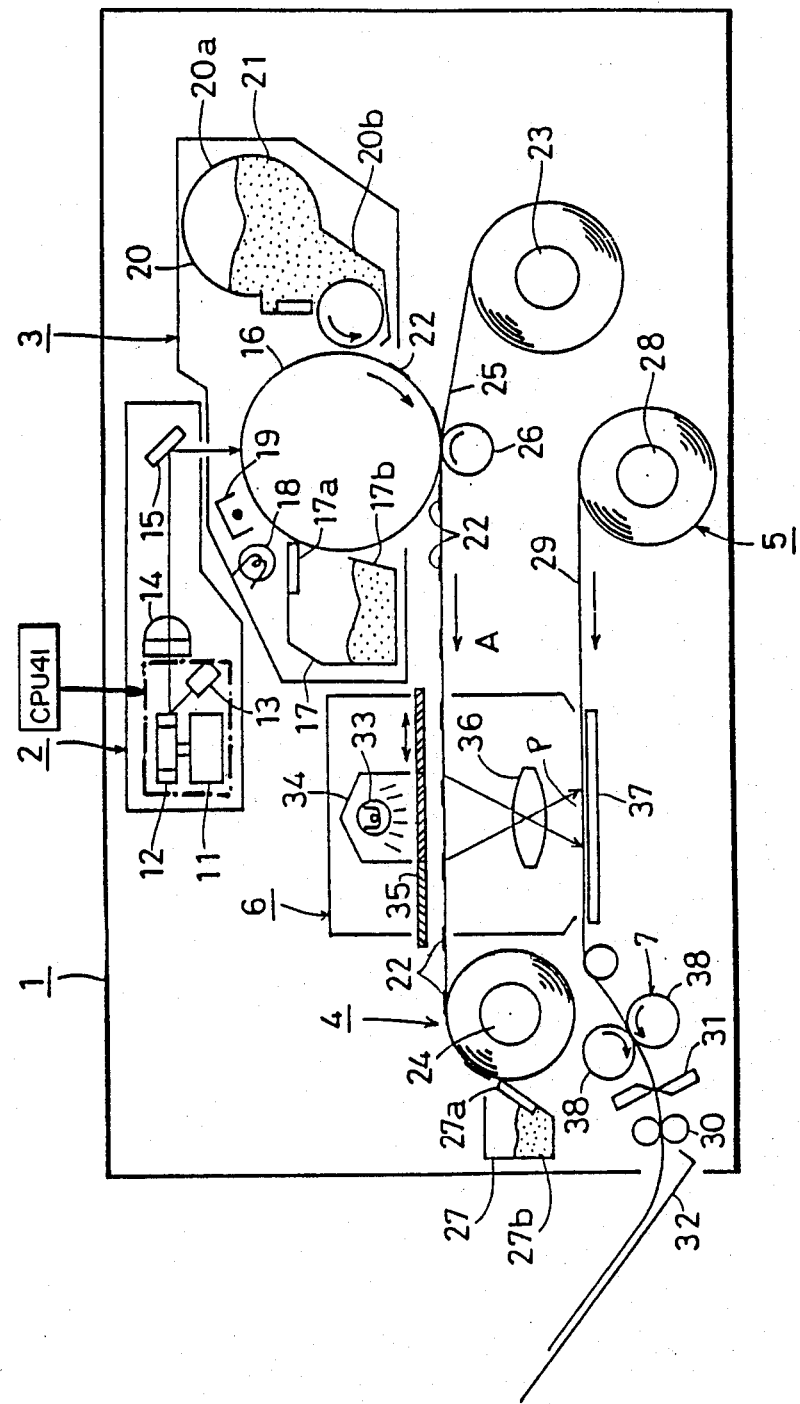
FIG. 1 is a schematic vertical cross-sectional view showing a color image recording apparatus according to a first embodiment of the present invention.
Figure 2:
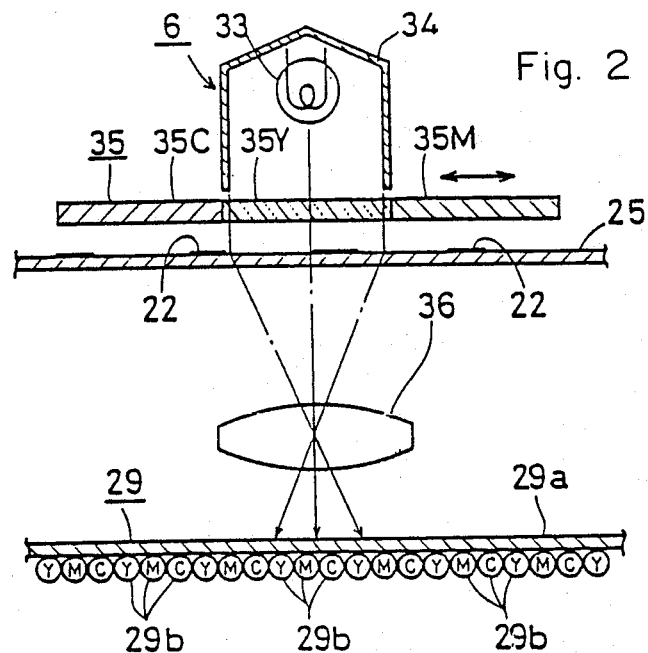
FIG. 2 is an enlarged cross-sectional view showing an exposure unit in the color image recording apparatus shown in FIG. 1.
Figure 3:
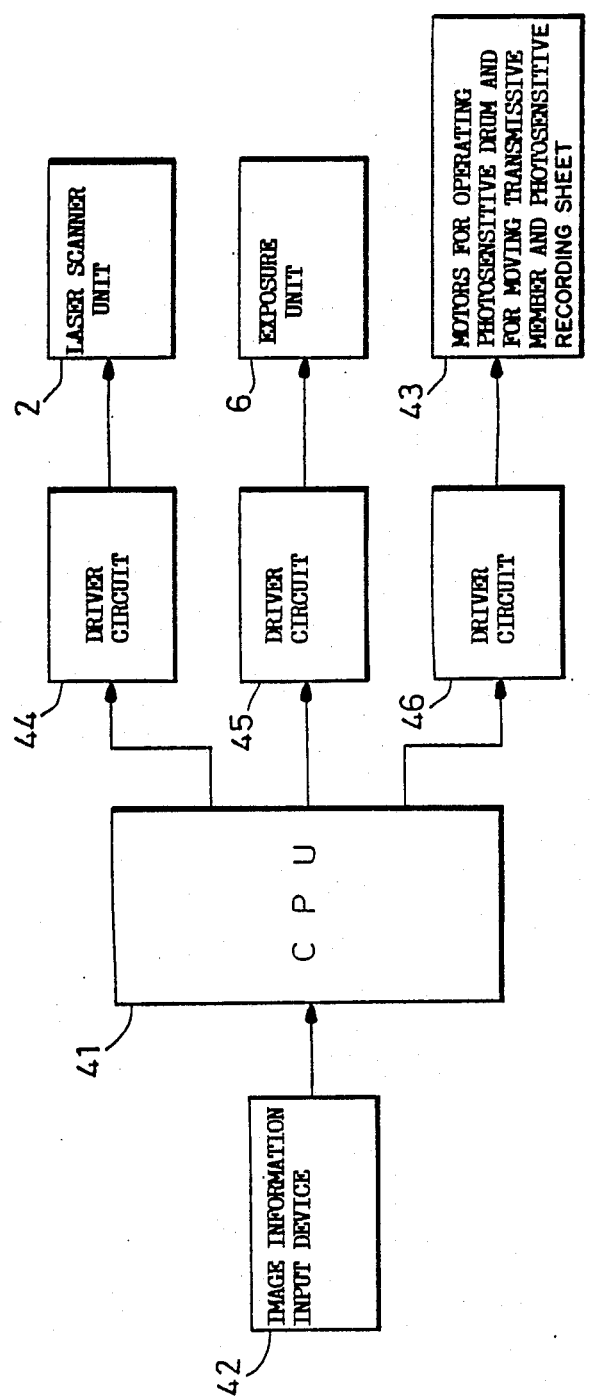
FIG. 3 is a block diagram showing a control circuit in the color image recording apparatus of FIG. 1; and, FIG. 4 is a fragmentary schematic vertical cross-sectional view showing a color image recording apparatus according to a second embodiment of the present invention.

FIGS. 1 through 3 show a color image recording apparatus according to a first embodiment of the present invention.

As shown in FIG. 1, the color image recording apparatus has a housing 1 accommodating therein a laser scanner unit 2, a xerographic unit 3, a transmissive member feeder unit 4, a photosensitive recording sheet feeder unit 5, an exposure unit 6, and a pressure developing unit 7.

The laser scanner unit 2 serves as a latent image forming means for forming a latent image on a photosensitive drum 16 on a basis of a given image information. The laser scanner unit 2 includes a motor 11, a polygon mirror 12 rotatable by the motor 11, a semiconductor laser 13 for applying a laser beam to the polygon mirror 12, an f0 lens 14, and a plane mirror 15 for reflecting the laser beam to the photo-sensitive drum 16. An image enlarging means such as CPU 14 (described later) is connected to the laser scanner unit 2. The CPU 41 may be connected to one of the motor 11 and the semiconductor laser 13.

The xerographic unit 3 includes the photosensitive drum 16 around which there are disposed a cleaning device 17, a charge eraser 18, a charger 19, an exposure area where the photosensitive drum 16 is exposed to the laser beam from the laser scanner unit 2, and a first image developing device 20, those being arranged successively in the direction in which the photosensitive drum 16 rotates. The cleaning device 17 includes a cleaning blade 17a and a toner recovery case 17b.

As the photosensitive drum 16 rotates, toner left on the circumferential surface of the drum 16 is removed by the cleaning blade 17a and collected in the toner recovery case 17b, and at the same time remaining electric charges are removed from the photosensitive drum 16 by the charge eraser 18. Thereafter, the photosensitive drum 16 is uniformly charged by the charger 19, and a laser beam is applied from the laser scanner unit 2 to the photo-sensitive drum 16 under the control of the central processing unit (CPU) 41 (see FIG. 3) based on image information stored in an image information input device 42, to remove electric charges from an image area on the drum 16, so that an enlarged electrostatic latent image corresponding to the image information is formed on the photosensitive drum 16 at a given magnification with respect to the image information.

The first image developing unit 20 includes a toner case 20a housing black toner 21 as a light-shielding material which has been charged at the same polarity as that of a non-image area on the photosensitive drum 16. The unit 20 also includes a developing sleeve 20b. The toner 21 is not attached to the non-image area on the photosensitive drum 16 under electrostatic repulsive forces, but is attached only to the image area on the drum 16 for reverse image development. Thus, a light-shielding visible toner image 22 corresponding to the electrostatic latent image is produced on the photosensitive drum 16.

The image developing process may however be effected for normal image development. In the latter case, a laser beam is applied to the uniformly charged photosensitive drum 16 in a non-image area of image information to retain electric charges in an image area. Then, the toner 21 which has been charged at the polarity different from that of the image area is electrostatically attracted to the image area to form a light-shielding visible image 22.

The transmissive member feeder unit 4 includes a pair of rollers 23, 24, a sheet-like transmissive member 25, an image transfer roller 26, and a cleaning device 27. The pair of rollers 23 and 24 are disposed at opposite end portions of the recording apparatus, and the sheet-like transmissive member 25 is wound at the rollers 23, 24 and is movable from the righthand roller 23 to the lefthand roller 24. The sheet-like transmissive member 25 serves as an image carrier made of a light-transmissive material such as polyethylene terephthalate. The image transfer roller 26 is disposed underneath the transmissive member 25 for interposing the photosensitive drum 16 therebetween, and a cleaning device 27 is positioned near the lefthand roller 24.

The image transfer roller 26 undergoes sufficient electrical charges whose polarity is different from that of the toner 21 to allow the toner 21 on the photosensitive drum 16 to be released therefrom thereby transferring the light-shielding visible image 22 from the photosensitive drum 16 onto the transmissive member 25. The cleaning device 27 includes a cleaning blade 27a and a toner recovery case 27b. After the light-shielding visible image 22 that has been transferred to the transmissive member 25 is used as a mask, it is cleaned off from the transmissive member 25 by the cleaning blade 27a and collected in the toner recovery case 27b. Thus, the combination of the laser scanning unit 2, the xerographic unit 3 and the image transfer roller 26 provides a mask image forming means for forming light shieldable toner mask image on the transparent transmissive member 25.

The photosensitive recording sheet feeder unit 5, disposed below the exposure unit 6, includes a supply roller 28, a pair of feed rollers 30, a cutter device 31, and a sheet tray 32. The supply roller 28 is adapted for supplying a photosensitive recording sheet 29 so as to lie below and in spaced relation to the transmissive member 25 remotely from the surface of the member 25 on which the light-shielding visible image 22 is formed. The pair of feed rollers 30 are adapted for feeding the photosensitive recording sheet 29 in the same direction as the travelling direction of the transmissive member 25. The cutter device 31 is adapted for cutting off the photosensitive sheet 29 to a prescribed length. The sheet tray 32 is positioned at one side of the apparatus for receiving the cut photosensitive sheet 29.

In this embodiment, a color-print photosensitive pressure-sensitive sheet is used as the photosensitive recording sheet 29. As shown in FIG. 2, the photosensitive pressure-sensitive sheet 29 comprises a transparent resin base 29a coated on its back with pressure-rupturable microcapsules 29b encapsulating dye precursors of cyan, magenta, and yellow, and photo-curable resin, and also with a color developer for reacting with the dye precursors to develop colors. Such type of sheet is generally referred to as a self-contained type recording medium typically disclosed in U.S. Patent 4,440,846.

The exposure unit 6 serves as an exposure means for forming a latent image on the photosensitive recording sheet 29 based on the light-shielding visible image 22 on the transmissive member 25. The exposure unit 6 includes an exposure lamp 33, a light reflector 34, an interference filter 35, a focussing or objective lens 36, and an exposure stand 37. The interference filter 35 is provided with three filter elements 35C 35M and 35Y for selectively passing only one of those lights of wavelengths corresponding to cyan, magenta, and yellow. The focussing or objective lens 36 serves as an image reduction means for concentrating the light that has passed through the transmissive member 25 and applying the light to the photosensitive recording sheet 29 at a given reduction ratio. The exposure stand 37 is adapted for resting the photosensitive sheet 29 thereon.

The interference filter 35 includes the above mentioned three color filter elements 35Y, 35M, 35C corresponding to yellow, magneta, and cyan, as shown in FIG. 2. With one of the filter elements 35Y, 35M, 35C selected and positioned in the light path below the exposure lamp 33, light is applied by the exposure lamp 33 from the side of the transmissive member 25 on which the light-shielding latent image 22 is formed, to the photosensitive recording sheet 29 for photocuring only those of the microcapsules 29b which correspond to the selected color filter element, on the photosensitive recording sheet 29 in an area except for the area corresponding to the light-shielding visible image 22. Thus, a latent image corresponding to the light-shielding visible image 22 is formed on the photosensitive recording sheet 29 at a reduction ratio given by the focussing lens 36 with respect to the light-shielding visible image 22.

Three latent images corresponding to the filter elements 35Y, 35M, 35C are successively formed in superposed relation on the photosensitive recording sheet 29 in the same manner as described above. Such tequnique per se is disclosed in the copending U.S. Patent Application Ser. No. 184,576 filed Apr. 21, 1988.

The pressure developing unit 7 serving as an image developing means for visualizing the latent image on the photosensitive recording sheet 29 includes a pair of separable pressure rollers 38. When the photosensitive recording sheet 29 is pressed by the pressure rollers 38 while moving therebetween, those microcapsules 29 which have not been photocured are ruptured, allowing the dye precursors to flow out and react with the color developer. The latent image on the photosensitive recording sheet 29 is visualized into an image which is equal in size to the input image information.

A control circuit in the color image recording apparatus will next be described with reference to FIG. 3. The image information input device 42 is connected to the CPU 41 for applying desired image information to the CPU 41. To the CPU 41, there are connected the laser scanner unit 2, the exposure unit 6, and various motors 43 for operating or moving the photosensitive drum 16, the transmissive member 25, and the photosensitive recording sheet 29 through respective driver circuits 44, 45, 46. The CPU 41 applies drive signals to the driver circuits 44, 45, 46.

In this embodiment, the CPU 41 provides an image enlarging means for enlarging image information supplied from the image information input device 42 at a given enlargement ratio, and supplying the enlarged image information to the laser scanner unit 2. Therefore, a latent formed on the photosensitive drum 16 by the laser scanner unit 2 is greater in size than the original image information. The enlargement ratio at which a latent image is formed on the photosensitive drum 16 is selected to be m when the reduction ratio at which an image is formed on the photosensitive recording sheet 29 by the focussing lens 36 is 1/m.

The motors 43 are driven in timed relation under the control of the CPU 41. When the photosensitive drum 16 is rotated at a certain speed in clockwise direction shown in FIG. 1, the transmissive member 25 is moved in the direction indicated by an arrow A at the same speed as the peripheral speed of rotating photosensitive drum 16.

An operation sequence, particularly for printing a color image, of the image recording apparatus thus constructed will hereinafter be described.

In the color image recording apparatus, latent images of yellow, magenta, and cyan are successively formed on the photosensitive recording sheet 29. More specifically, the photosensitive drum 16 is rotated in clockwise direction in FIG. 1, and the transmissive member 25 is moved in the direction of the arrow A. At the same time, a light shielding visible image 22 corresponding to yellow is formed on the photosensitive drum 16 by the laser scanner unit 2 and the first developing unit 20 at a given enlargement ratio with respect to original image information. The visible image 22 is then transferred onto the transmissive member 25 by the transfer roller 26.

Then, the yellow filter element 35Y of the interference filter 35 is positioned in the light path in the exposure unit 6, and light is applied from the exposure lamp 33 through the filter element 35Y, the transmissive member 25, and the focussing lens 36 to the photosensitive recording sheet 29. Those of the microcapsules 29a on the photosensitive recording sheet 29 which correspond to yellow and have not been exposed to the light due to the light-shielding visible image 22 are not photocured, but the other microcapsules 29a corresponding to yellow and exposed to the light are photocured. Thus, a latent image corresponding to yellow is formed on the photosensitive recording sheet 29 at a given reduction ratio with respect to the light-shielding visible image 22.

Thereafter, the light-shielding visible image 22 corresponding to yellow on the transmissive member 25 is cleaned away by the cleaning device 27. The righthand roller 23 is rotated to move the transmissive member 25 in the direction opposite to the direction of the arrow A until the transmissive member 25 restores its original position with respect to the image transfer roller 26. At this time, the photosensitive recording sheet 29 remains at rest in an exposure area of the exposure unit 6.

Latent images of magenta and cyan are successively formed on the photosensitive sheet 29 in the same manner as described above. More specifically, enlarged light-shielding visible images 22 corresponding to magenta and cyan are successively transferred from the photosensitive drum 16 onto the transmissive member 25, after which the visible images 22 are successively positioned in the exposure unit 6. In the exposure unit 6, the filter 35M of magenta or the filter 35C of cyan is disposed in the light path, and light is applied through the filter to the photosensitive recording sheet 29 to form a latent image corresponding to magenta or cyan thereon.

After the latent images of the respective colors have been formed, the photosensitive sheet 29 is moved by the feed rollers 30 and pressed by the pressure rollers 38 of the pressure developing unit 7. The microcapsules 29b corresponding to the respective colors which have not been photo-cured are ruptured, and the dye precursors flow out of the ruptured microcapsules 29b to react with the color developer for thereby developing a colored image of the same size as that of the original image information on the photosensitive recording sheet 29.

In the color image recording apparatus of the above embodiment, as described above, the light-shielding visible images 22 of the respective colors are successively formed on the photosensitive drum 16 at a given enlargement ratio with respect to the original image information, and then transferred onto the sheet-like transmissive member 25. Thereafter, light is applied to the photosensitive recording sheet 29 through the light-shielding visible images 22 on the transmissive member 25 to form successive latent images on the photosensitive recording sheet 29 at a reduction ratio with respect to the light-shielding visible images 22, after which the latent images are successively developed into a colored image.

The sheet-like transmissive member 25 is wound at its opposite ends on the rollers 23, 24 and movable between these rollers 23, 24. If a certain area of the transmissive member 25 is damaged or smeared by the cleaning blade 17a, for example, of the cleaning device 27, the lefthand roller 24 may be rotated by a takeup switch or the like (not shown) to wind the damaged or smeared area on the roller 24 and introduce a new area of the transmissive member 25 from the righthand roller 23. Therefore, images of high quality which are free from undesirable defects can be formed on the photosensitive recording sheet 29 at all times.

When the entire length of the transmissive member 25 has been used up and wound on the lefthand roller 24, the used transmissive member 25 may be removed together with the rollers 23, 24, and a new transmissive member 25 may be loaded for subsequent use.

A color image recording apparatus according to a second embodiment of the present invention will be described below with reference to FIG. 4.

Figure 4:
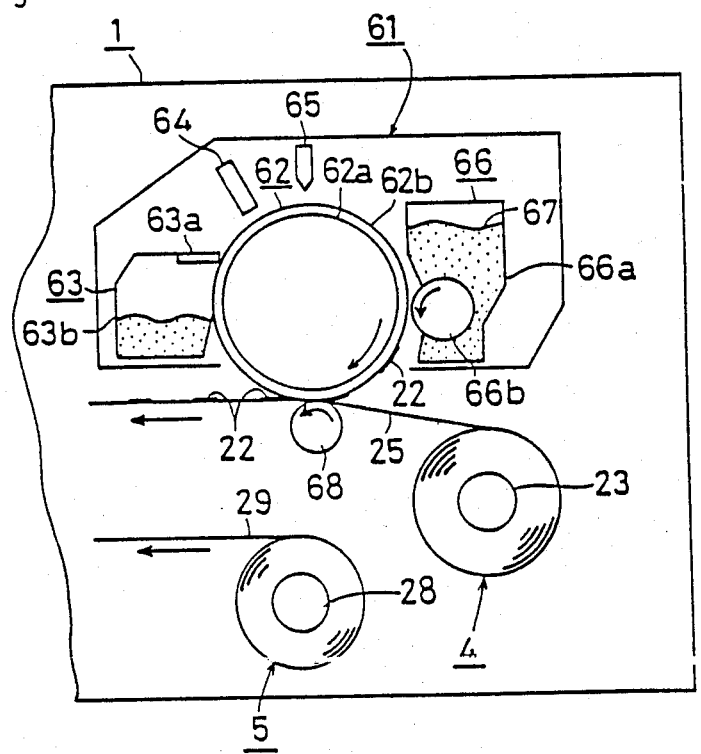

In the embodiment shown in FIG. 4, the laser scanner unit 3 and the xerographic unit 3 used in the previous embodiment are replaced with a magnetographic unit 61. The other components of the color image recording apparatus in the second embodiment shown in FIG. 4 are identical to those of the color image recording apparatus shown in FIG. 1, and are denoted by identical reference numerals and will not be described in detail.

The magnetographic unit 61 has a magnetic drum 62 around which there are disposed a cleaning device 63 having a cleaning blade 63a and a toner recovery case 63b, a demagnetizer 64, a magnetic head 65, and an image developing unit 66 having a case 66a for containing black magnetic toner 67 as a light-shielding material and a developing sleeve 66b, those being successively arranged in the direction in which the magnetic drum 62 is rotatable.

The magnetic drum 62 has a drum body 62a formed of aluminum and a magnetic layer 62b disposed on the outer peripheral surface of the drum body 62a. As the magnetic drum 62 rotates, magnetic toner on the outer peripheral surface of the magnetic drum 62 is cleaned away by the cleaning device 63, and any residual magnetism is removed from the magnetic drum 62 by the demagnetizer 64. Thereafter, a magnetic latent image based on given image information is formed on the magnetic drum 62 by the magnetic head 65 at a prescribed enlargement ratio, and then magnetic toner 67 is magnetically attracted to the magnetic latent image by the image developing unit 66 to develop a light-shielding visible image 22.

In this embodiment, a sufficient electrostatic attractive force to remove the magnetic toner 67 from the magnetic drum 62 is generated at a transfer roller 68 serving as a transfer means for transferring the light-shielding visible image 22 from the magnetic drum 62 onto the transmissive member 25. Subsequently, a latent image is formed at a given reduction ratio on the photosensitive recording sheet 29 by light that has passed through the transmissive member 25 which carries the light shieldable visible image 22 thereon, and then the latent image is developed into a visible image, in the same manner as described above with reference to the first embodiment.

In the second embodiment, similar to the first embodiment, by enlarging and then reducing the images, it is also possible to form a high-quality output image on the photosensitive recording sheet 29 at a resolution higher than the resolution of the magnetographic unit 61.

The present invention is not limited to the above two illustrated embodiments, but may be modified in various ways as follows:

(1) The transmissive member 25 may be wound up on the lefthand roller 24 by a prescribed length each time a certain number of exposure cycles are performed, so that new areas of the transmissive member 26 can automatically be used in succession.

(2) A stack of separate photosensitive recording sheets 29 may be stored in a sheet cassette, and one, at a time, of such photosensitive recording sheets 29 may be supplied from the sheet cassette into the exposure area P of the exposure unit 6 by a sheet feeder.

(3) The transparent resin base 29a of the photo-sensitive recording sheet 29 may be coated with only microcapsules 29b encapsulating dye precursors corresponding to respective basic colors and photosetting resin, and a separate sheet may be coated with a color developer. That is, a transfer type recording medium can also be available in the present invention. The transfer type recording medium is typically disclosed in U.S. Pat. No. 4,399,209.

(4) The photosensitive recording sheet 29 may be of the type which develops colors and fixes a developed image in response to application of heat.

(5) A photosensitive recording sheet coated with microcapsules encapsulating a dye precursor corresponding to only one of black, yellow, magenta, or cyan may be used to operate the color image recording apparatus as a monochromatic image recording apparatus.

(6) In the second embodiment shown in FIG. 4, a thermomagnetic recording process may be employed in which the magnetic drum 62 that is uniformly magnetized is locally heated based on given image information to erase or reverse the magnetism to form a magnetic latent image.

(7) An image may be formed on the transparent film 25 by a dot matrix impact process, a thermal transfer process, or other image forming process.

With the arrangement of the present invention, as described above, image information applied from the image information input device 42 is enlarged at a prescribed enlargement ratio, and an image is formed on the transparent film 25 based on the enlarged image information by the image forming means such as a laser scanner unit, a magnetographic unit, a dot matrix impact process, or a thermal transfer process, for example. The image on the transparent film 25 is then reduced by a reducing means and recorded on the photosensitive recording sheet 29 as a high-quality image having a resolution higher than the resolution which the recording means can provide.

More specifically, the image forming means can provide limited resolution, and the higher the required resolution, the higher the accuracy and hence the cost of the image forming means must be. Since the photosensitive recording sheet 29 inherently provides high resolution, and therefore, provide much higher resolution than the resolution brought by an effort in improving the image forming means, it is important for the image recording apparatus to be able to form high-resolution images on the photosensitive recording sheet. According to the present invention, an enlarged image on the transparent film 25 is reduced in size to produce a high-quality image on the photosensitive recording sheet having high resolution with its resolution exceeding the resolution which can be provided by the image forming means.

Although certain preferred embodiments have been shown and described, it should be understood that many changes and modifications may be made therein without departing from the spirit and scope of the invention.

What is claimed is:

1. An image recording apparatus for providing an image on a photosensitive recording medium comprising:
    a light-transmissive image carrier for carrying a light shielding image thereon;
    image forming means for forming said light-shielding image on said image carrier based on given image information;
    exposure means which applies light to said photosensitive recording medium through said image carrier for forming a latent image on said photosensitive recording medium, said photosensitive recording medium being disposed in confronting relation with said image carrier at least at said exposure means;
    image developing means disposed at downstream side of said exposure means for visualizing said latent image on said photosensitive recording medium;
    enlarging means connected to said image forming means for providing an enlarged image information to form said light-shielding image having enlarged size on said image carrier with respect to said image information; and
    reducing means disposed at said exposure means for reducing said latent image to be formed on said photosensitive recording medium with respective to the light-shielding image on said image carrier.

2. The image recording apparatus as defined in claim 1, wherein said enlarging means provides magnification ratio of M between said given image information and said light shielding image on said image carrier, and said reducing means provides a reduction ratio of 1/M between said light shielding image and said latent image on said photosensitive recording medium.

3. An image recording apparatus as defined in claim 1, further comprising a pair of rollers on which said image carrier is wound at respective opposite ends thereof, said rollers being rotatable to move said image carrier therebetween.

4. The image recording apparatus as defined in claim 1, wherein said photosensitive recording medium comprises a self-contained type recording medium in which an encapsulated chromogenic material and a developer material are co-deposited on one surface of a single substrate.

5. The image recording apparatus as defined in claim 1, wherein said photosensitive recording medium comprises a separate type recording medium in which an encapsulated chromogenic material is deposited on a first substrate and a developer material is coated on a second substrate as a separate developer sheet, and further comprising a means for feeding said separate developer sheet to said image developing means for superposing with said first substrate which carries said latent image, whereby said visualized image is formed on said separate developer sheet.

6. The image recording apparatus as defined in claim 1, wherein said image forming means comprises:
    a laser scanner unit for applying a laser beam;
    a xerographic unit disposed at a position adjacent to said laser scanner unit for forming an electrostatic latent image responsive to said laser beam and for providing a toner image corresponding to said electrostatic latent image; and,
    an image transfer roller disposed in confrontation with said xerographical unit for transferring said toner image onto said light-transmissive image carrier to thereby provide said light-shielding image thereon, said enlarging means being connected to said laser scanner unit.

7. The image recording apparatus as defined in claim 1, wherein said image forming means comprises;
    a magnetographic unit for providing a magnetic latent image based on said given image information so as to provide said light-shielding image at said magnetic latent image; and,
    a transfer roller for transferring said light-shielding image onto said image carrier, said transfer roller being applied with electrical charges, said enlarging means being connected to said magnetographic unit.

* * * * *